United States Patent [19]

Moyal et al.

[11] Patent Number: 5,287,015
[45] Date of Patent: Feb. 15, 1994

[54] COMPARATOR CIRCUIT

[75] Inventors: Miki Z. Moyal; Ryan E. Feemster, both of Austin, Tex.

[73] Assignee: Advanced Micro Devices, Inc., Sunnyvale, Calif.

[21] Appl. No.: 824,029

[22] Filed: Jan. 22, 1992

Related U.S. Application Data

[63] Continuation-in-part of Ser. No. 609,563, Nov. 5, 1990, abandoned, which is a continuation-in-part of Ser. No. 481,769, Feb. 16, 1990, abandoned, which is a continuation-in-part of Ser. No. 286,206, Dec. 19, 1988, abandoned.

[51] Int. Cl.$^5$ .................. H03K 5/24; H03K 17/16
[52] U.S. Cl. ............................ 307/355; 307/279; 307/530; 307/491; 307/443; 307/494; 307/572
[58] Field of Search ............... 307/350, 355, 279, 530, 307/491, 494, 443, 572

[56] References Cited

U.S. PATENT DOCUMENTS

| | | | |
|---|---|---|---|
| 4,028,558 | 6/1977 | Heller et al. | 307/355 |
| 4,150,311 | 4/1979 | Matsuda et al. | 307/530 |
| 4,511,810 | 4/1985 | Yukawa | 307/530 |
| 4,644,197 | 2/1987 | Flannagan | 307/530 |
| 4,883,987 | 11/1989 | Fattaruso | 307/355 |
| 4,900,952 | 2/1990 | Hosotani et al. | 307/355 |

Primary Examiner—John Zazworsky
Attorney, Agent, or Firm—Foley & Lardner

[57] ABSTRACT

An apparatus is disclosed for comparing a first input signal with a second input signal and generating an output signal representative of that comparison in response to a system clock signal. The apparatus comprises a plurality of amplifying circuits. A first amplifying circuit generates a pair of first amplifier signals representative of the input signals applied to the apparatus. A second amplifying circuit receives the pair of first amplifier signals and generates a pair of second amplifier signals representative of the pair of first amplifier signals. A delay circuit receives the system clock signal and generates a delayed clock signal which follows the system clock signal by predetermined interval. A first switching circuit is operatively connected across the first amplifier outputs and responds to the system clock signal. A second switching circuit is operatively connected across the second amplifier outputs and is responsive to the delayed clock signal. The predetermined interval between the system clock signal and the delayed clock signal is preferably appropriate to facilitate substantial decay of noise introduced into the pair of first amplifier signals by the opening of the first switching circuit.

10 Claims, 2 Drawing Sheets

COMPARATOR CIRCUIT

This is a continuation-in-part of Application Ser. No. 07/609,563, filed Nov. 5, 1990, now abandoned, which is a continuation-in-part of Application Ser. No. 07/481,769, filed Feb. 16, 1990, now abandoned which was a continuation-in-part of Application Ser. No. 07/286,206, filed Dec. 19, 1988, now abandoned.

BACKGROUND OF THE INVENTION

Comparator circuits are well known in the electronics industry. Such circuits are used in a variety of situations for comparing a first signal with a second signal and generating an output representative of that comparison for use in numerous ways by other circuitry. For example, the output of a comparator may be used in making a decision in a circuit implementing an algorithm, checking limits in an algorithm, or generally for making any decision based upon the outcome of a comparison of two signals.

In today's environment, speed of operation of a computer is a concern to computer designers, and applies to computers of all sizes, from large mainframe computers to microprocessors employed in circuits as diverse as home appliances and automobiles.

In addition to being fast, a comparator circuit should be responsive to an acceptably wide swing of signals in order that it may be used in a wide variety of applications. Having to specifically design a given comparator circuit for a given application, as is the case with such "tailoring" of most components, adds to cost of design and construction of circuits employing those components.

Another criterion of design for any electronic circuit, including comparator circuits, is that the circuit accurately perform the function for which it is designed. Specifically, a comparator circuit must accurately produce an output representative of the true difference between signals received as inputs. The comparator circuit should not itself introduce anomalies, noise, or other sources of inaccuracy which can cause it to generate internal inaccuracies during its operation and, thus, to produce spurious outputs. Reducing noise enables the comparator circuit to be responsive to small differences between input signals and to low value signals.

All of the design criteria: wide range of applicability in accepting input signals, speed of operation, responsiveness to small signal differences and to low value signals, and accuracy of response are not necessarily compatible or mutually supportive in their effects upon the design of a comparator circuit. It is, for example, important that a comparator in its non-comparative mode not be allowed to have too wide a range of signals internally present in its comparison circuitry. Too wide a diversity of such signals slows operation in the comparison mode because a significant swing in signal value is required in order to effect an appropriate comparison. Such significant swings in value take time and may be a source of noise or other inaccuracy.

It is also desirable that components employed in any electronic circuit, including comparator circuits, be employed in their optimal operating range in order that truest response of the various components may be advantageously employed.

Certain prior art solutions to the problem of internal introduction of inaccuracies in comparator circuits have involved multiple amplifier stages which are controlled in their active-inactive periods. By such controlling, circuitry may be pre-conditioned to a stable state at the optimal operating point of the various electronic components involved before comparison is effected between the two signals to be compared. Such an approach is taken by Heller et al. in U.S. Pat. No. 4,028,558, "High Accuracy MOS Comparator"; by Hosotani et al. in U.S. Pat. No. 4,900,952, "Voltage Comparison Apparatus"; and by Fattaruso in U.S. Pat. No. 4,883,987, "Comparator Circuit Having a Fast Recovery Time". However, such solutions are relatively slow in their response and require a large number of components.

The present invention provides a stable, accurate comparator circuit which quickly reacts to changes in inputs without introduction of disruptive noise to the output.

SUMMARY OF THE INVENTION

The present invention relates to electronic comparator circuits, and, in particular to an apparatus for comparing a first input signal with a second input signal and generating an output signal representative of that comparison in response to a system clock signal.

In its preferred embodiment, the apparatus of the present invention comprises a plurality of amplifying circuits. A first amplifying circuit generates a pair of first amplifier signals at a pair of first amplifier outputs; the first amplifier signals are representative of the first input signal and the second input signal applied to the apparatus. A second amplifying circuit is operatively connected to receive the pair of first amplifier signals and generate a pair of second amplifier signals at a pair of second amplifier outputs, which pair of second amplifier signals is representative of the pair of first amplifier signals. A delay circuit for delaying signals receives the system clock signal and generates a delayed clock signal which follows the system clock signal by predetermined interval. A first switching circuit is operatively connected across the pair of first amplifier outputs and responds to the system clock signal. A second switching circuit is operatively connected across the pair of second amplifier outputs and is responsive to the delayed clock signal. The predetermined interval between the system clock signal and the delayed clock signal is preferably appropriate to facilitate substantial decay of noise introduced into the pair of first amplifier signals by the opening of the first switching circuit.

Further in the preferred embodiment of the present invention, the plurality of amplifying circuits includes an initial amplifying circuit which receives the first and second input signals to the apparatus and generates a pair of initial amplifier outputs representative of those signals. The initial amplifying circuit operatively provides the pair of initial amplifier outputs as inputs to the first amplifying circuit described above. The initial amplifying circuit has a lower gain than the first amplifying circuit, thereby avoiding capacitive effects within the initial amplifier circuit (commonly known as the Miller effect, which establishes that every capacitance between an input and output of an amplifier is multiplied by the gain of that stage of amplification).

Thus, in the preferred embodiment of the present invention, the first and second input signals received by the apparatus are sequentially amplified by the plurality of amplifying circuits: first by the low-gain initial amplifier circuit, which provides its output as the input to the higher gain first amplifier circuit; then by the first amplifier circuit for establishing a greater differential between its pair of first amplifier outputs, which are representative of the first and second input signals received by the apparatus.

Speed of operation of the apparatus is enhanced by clamping the pair of first amplifier outputs together (by the first switching circuit) during a non-comparative mode of operation, thus limiting intersignal differentials between the pair of first amplifier signals during that non-comparative mode of operation. Such limiting of intersignal differentials ensures that the apparatus will deviate minimally when the first switching circuit is opened, thereby enhancing speed of response of the apparatus when comparative operation modes are initiated (by opening the first switching circuit). Thus, to initiate and perform a comparative operation, the first switching circuit is opened, thereby allowing the outputs of the first amplifier stage to diverge. However, sudden opening of such a switching circuit injects a charge to the switch terminals (commonly known as "charge injection" or "charqe feedthrough"). The relative magnitude of such charges, or parasitic capacitances, thus introduced by opening the first switching circuit is generally unknown and, therefore, the differential signal thus produced across the switch is unknown. The effect on signals can be positive or negative, and is of unpredictable magnitude. Therefore, comparing the outputs of the first amplifier circuit immediately after opening the first switching circuit likely would result in a spurious comparison since the noise introduced to the signals by charge injection could cause latching circuitry at the output of the comparator circuit to latch in a manner incorrectly reflecting a true comparison of the first and second input signals to the apparatus.

The second amplifier circuit, which receives the pair of first amplifier signals from the output of the first amplifying circuit and amplifies them to produce a pair of second amplifier outputs, has its output terminals (the second amplifier outputs) clamped together by a second switching circuit. The second switching circuit is maintained in its closed position, thereby clamping the second amplifier outputs together and precluding any amplification by the second amplifying circuit (effectively making the second amplifier a latch) until some period of delay has elapsed after the opening of the first switching circuit. The period of delay is predetermined appropriately to facilitate substantial decay of noise introduced to the pair of first amplifier signals by the opening of the first switching circuit (approximately nine nanoseconds). The second switching circuit is then opened, enabling the second amplifying circuit to amplify the signals received from the first amplifying circuit (i.e., the first pair of amplifier signals) to produce the second pair of amplifier signals which are operatively provided to a latching amplifier circuit for production of the output of the apparatus. The latching amplifier circuit effects amplification of signals it receives to a logic level magnitude for use by components external to the apparatus of the present invention.

It is, therefore, an advantage of the present invention to provide an apparatus for comparing a first input signal with a second input signal and generating an output signal representative of that comparing which is responsive to small differences between input signals.

A further advantage of the present invention is to provide an apparatus for comparing a first input signal with a second input signal and generating an output signal representative of such comparing which is speedily responsive to changes in input signals.

Yet a further advantage of the present invention is to provide an apparatus for comparing a first input signal with a second input signal and generating an output signal representative of such comparing which is accurate in its response and substantially not affected by noise generated internally of the apparatus.

Further objects and features of the present invention will be apparent from the following specification and claims when considered in connection with the accompanying drawings illustrating the preferred embodiment of the invention.

DETAILED DESCRIPTION OF THE INVENTION

Figure 1:
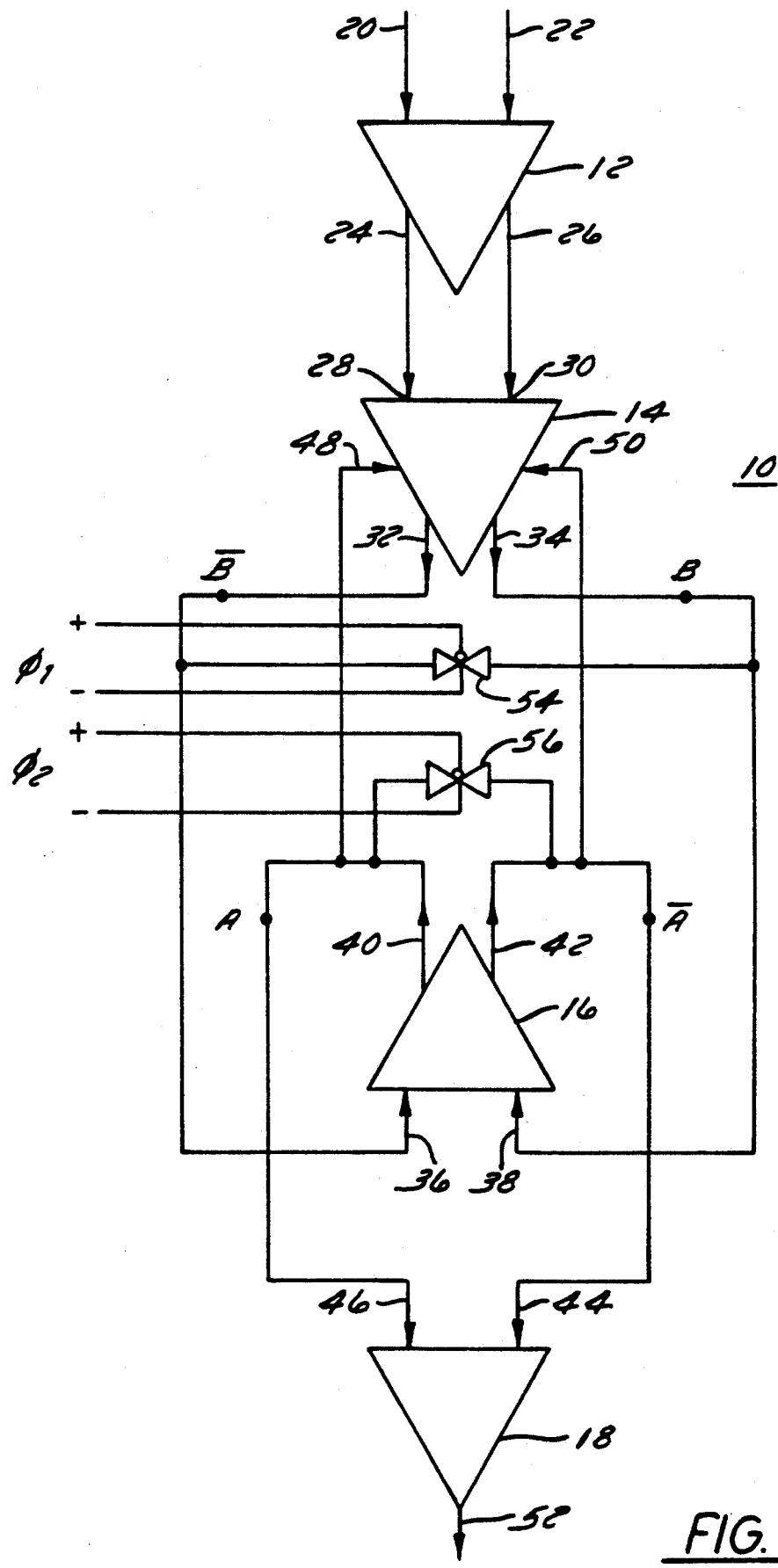
FIG. 1 is a schematic block diagram of the preferred embodiment of the present invention.

FIG. 1 is a schematic block diagram of the preferred embodiment of the present invention. In FIG. 1, a comparator apparatus 10 is illustrated including an initial amplifier 12, a first amplifier 14, a second amplifier 16, and a latching amplifier 18.

Initial amplifier 12 receives a first input signal at a first input terminal 20 and receives a second input signal at a second input terminal 22. Initial amplifier 12 is preferably a low-gain amplifier and generates a first initial amplifier signal at a first initial amplifier output 24 and a second initial amplifier signal at a second initial amplifier output 26.

The first initial amplifier signal is received as an input to first amplifier 14 at a first amplifier input terminal 28 and the second initial amplifier signal is received by first amplifier 14 as an input at first amplifier input terminal 30. First amplifier 14 is, preferably, a high-gain amplifier, as compared with initial amplifier 12, and generates a pair of first amplifier signals at first amplifier outputs 32, 34. The pair of first amplifier signals are provided as inputs to second amplifier 16 at second amplifier inputs 36, 38. Second amplifier 16 is preferably configured as a low-gain amplifier for effecting level shifting of signals in order that input signals provided to latching amplifier 18 by second amplifier 16 will be in an appropriate range for efficient operation of latching amplifier 18.

Second amplifier 16 generates a pair of second amplifier signals at second amplifier outputs 40, 42. Second amplifier outputs 40, 42 are electrically operatively connected with latching amplifier inputs 44, 46 and are further connected with first amplifier 14 via feedback inputs 48, 50, preferably in a manner providing positive feedback of the pair of second amplifier signals to first amplifier 14 in a manner whereby the pair of second amplifier signals are regeneratively amplified by first amplifier 14.

Latching amplifier 18 receives the pair of second amplifier signals at latching amplifier inputs 44, 46 and generates an output signal on latching amplifier output 52. The output signal is representative of the difference between the first input signal received at first input terminal 20 and the second input signal received at second input terminal 22.

Nodes B and are, respectively, electrically connected with first amplifier outputs 32, 34; nodes A and A are electrically common with second amplifier outputs 40, 42. A first switch 54 electrically connects nodes A, A and is responsive to a clocking signal $\phi_1$. A second switch 56 electrically connects A and A and is responsive to a second clocking signal $\phi_2$. In the preferred embodiment of the present invention, $\phi_2$ is a delayed clocking signal derived from clocking signal $\phi_1$.

In operation, comparator apparatus 10 receives a first input signal and a second input signal at first input terminal 20 and second input terminal 22 of initial amplifier 12. Initial amplifier 12 is a low-gain device in order to ensure high-speed operation of apparatus 10. There is an effect known as the Miller effect which establishes that every capacitance between an input and output of an amplifier is multiplied by the gain of that stage of the amplifier. Thus, capacitance in an amplifier will be amplified by the gain of the amplifier and slow the response of that amplifier as well as the entire device in which the amplifier is employed. Certainly bias transistors or other buffering elements could be employed at the inputs of initial amplifier 12 to minimize the Miller effect, but such biasing or buffering devices generally limit the response of the amplifier involved to a narrower range of applied voltages. In order to ensure that comparator apparatus 10 responds to as wide a range of inputs as possible (thereby rendering its employment in electronic circuitry less specialized and, hence, more economical) no biasing or buffering devices are contemplated as being employed at first input terminal 20 or second input terminal 22 of initial amplifier 12.

Initial amplifier 12, thus, amplifies the first and second input signals received at first input terminal 20 and second input terminal 22 and generates initial amplifier signals at initial amplifier outputs 24, 26. First amplifier 14 receives the outputs of initial amplifier 12 at first amplifier input terminals 28, 30 and, in turn, amplifies those signals, generating first amplifier signals at first amplifier outputs 32, 34.

Preferably, first amplifier 14 has a higher gain than initial amplifier 12. First amplifier 14 can be operated at a higher gain because the previously-mentioned biasing and buffering devices are, in fact, contemplated as being employed at the inputs to first amplifier 14, thereby eliminating the Miller effect in first amplifier 14. First amplifier 14 generates a pair of first amplifier signals at its outputs 32, 34, providing those signals as inputs received by second amplifier 16 at its input terminals 36, 38. First amplifier output 32 is electrically in common with node and first amplifier output 34 is electrically in common with node B.

Second amplifier 16 is designed to shift signals at nodes B and B upward approximately 1.2 volts to place its outputs (signals A and A) in an optimal operating range for latching amplifier 18. Thus, second amplifier 16 generates second amplifier signals at output terminals 40, 42, which second amplifier signals at nodes A, A are provided as inputs to latching amplifier 18 at latching amplifier inputs 44, 46. Signals at nodes A, A are also provided in a positive feedback connection to feedback inputs 48, 50 of first amplifier 14. As will be described in greater detail hereinafter, the application of signals at nodes A, A to first amplifier 14 are effected in a manner providing for regenerative amplification of signals at nodes A, A by first amplifier 14.

Latching amplifier 18 generates an output 52 representative of the comparison of input signals received at input terminals 28, 22 of initial amplifier 12. Latching amplifier 18 is preferably a low-gain amplifier which has appropriate gain to place its output 52 at logic levels employable by external circuitry (not shown in FIG. 1).

Initially in its operation, comparator apparatus 10 is configured with both switches 54, 56 closed. In such configuration, nodes B, B are in common and nodes A, A are in common. The establishing of nodes B, B in common limits the differential spread of signals between nodes B and B, thereby ensuring that when a comparison mode is selected (by opening switches 14, 16 in a sequential manner hereinafter described) neither node B nor node B will experience an unacceptable degree of digression to reflect the appropriate current differential established between nodes B, during the comparison stage. Such limiting of the variance of differential currents enhances the speed of response of comparator apparatus 10.

To initiate the comparison operation of comparator apparatus 10, first switch 54 is opened while keeping second switch 56 closed. In such a configuration, nodes B and freed to reflect the differential current established by the difference between the first input signal received at first input terminal 20 and the second input signal received at second input terminal 22. Thus, a current differential is established between nodes B and B. However, by keeping second switch 56 closed and keeping nodes A, A (the outputs of second amplifier 16) in common, second amplifier 16 is precluded from amplifying and, in effect, operates as a latch. The opening of switch 56 is dependent upon the second clocking signal $\phi_2$. Clocking signal $\phi_2$ is timed to lag clocking signal $\phi_1$ by a delay period which is predetermined to provide sufficient time between the opening of first switch 54 and the opening of second switch 56 to allow substantial decay of noise introduced to nodes B and B by the opening of first switch 54. The opening of first switch 54 introduces parasitic capacitances to circuitry electrically connected with first switch 54, which capacitances inject noise to nodes B, B. This effect is commonly referred to as "charge injection" or "charge feedthrough". Because the relative magnitudes of the various parasitic capacitances introduced by the opening of first switch 54 are unknown and are generally unpredictable, the differential signal produced between nodes B, B is also unknown; it can be positive or negative, and can be almost any value. It is this unpredictable noise which must decay before further amplification of the differential signals on nodes B, B are further amplified by second amplifier 16 and latching amplifier 18 in order to ensure true response by comparator apparatus 10. Therefore, at a predetermined time after first switch 54 has opened, delay clocking signal $\phi_2$ effects opening of second switch 56, thereby electrically isolating nodes A, A and enabling second amplifier 16 to operate as an amplifier to provide its output signal differential signals to nodes A, A, thence to latching amplifier 18. The gain of second amplifier 16 is appropriately established to render inconsequential the effects of charge injection or charge feedthrough occasioned by the opening of second switch 56.

For purposes of facilitating understanding of the present invention, like elements will be identified by like reference numerals in the various drawings.

Figure 2:
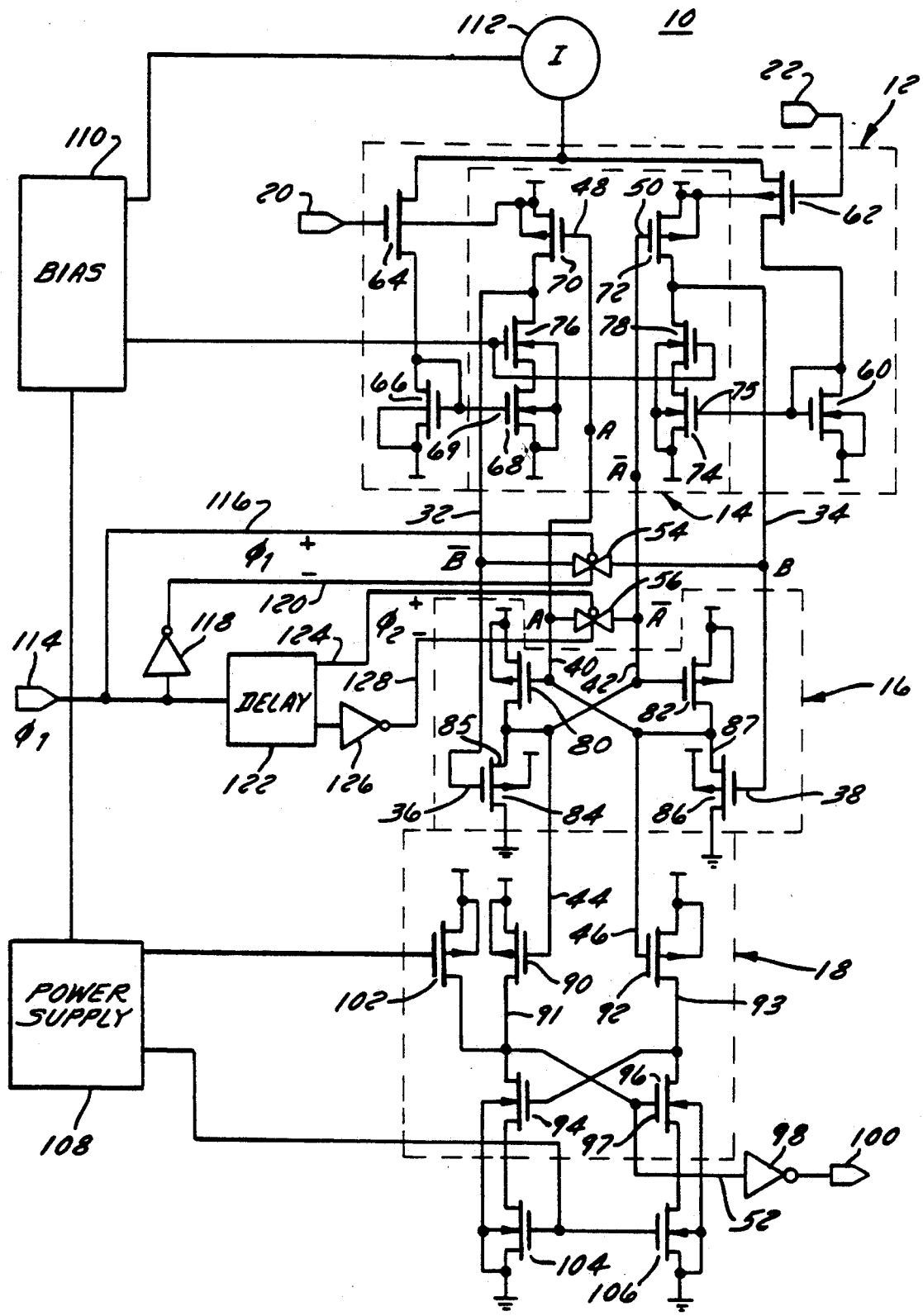
FIG. 2 is a detailed schematic drawing of the apparatus illustrated in FIG. 1.

FIG. 2 is a detailed schematic drawing of the apparatus illustrated in connection with FIG. 1.

In FIG. 2, initial amplifier 12 is illustrated as being comprised of field effect transistors (FET) 60, 62, 64, 66. First input terminal 20 is connected to apply input signals to FET 64 and second input terminal 22 is connected to apply input signals to FET 62.

First amplifier 14 is comprised of FETs 68, 70, 72, 74. First amplifier 14 further includes FETs 76, 78 which are employed as bias transistors to minimize the previously-described Miller effect within first amplifier 14. First amplifier output 32 is electrically common with node B and first amplifier output 34 is electrically common with node B. Second amplifier 16 is comprised of FETs 80, 82, 84, 86. Second amplifier input 36 is electrically common with node B and second amplifier input 38 is electrically common with node B. Second amplifier output 40 is electrically common with node A, and second amplifier output 42 is electrically common with node A. Further, latching amplifier input 44 is electrically common with node A and with second amplifier output 42, and latching amplifier input 46 is electrically common with node A and second amplifier output 40. Feedback is provided from second amplifier 16 to feedback input 48 at FET 70 and to feedback input 50 at FET 72.

Latching amplifier is comprised of FETs 90, 92, 94, 96 and output 52 is electrically common with the gate 97 of FET 96. Output 52 is applied to an inverter 98 and, thereafter, to an output terminal 100.

FETs 102, 104, 106 are associated with power supply 108 and are employed for properly setting power levels and biases. Power supply 108 is further employed in connection with bias circuit 110 for setting biases in first amplifier 14 and in constant current source 112.

Clocking signal $\phi_1$ is applied at a terminal 114, thence to switch 54 via a line 116 and, in its inverted mode, via an inverter 118 and a line 120. Clocking signal $\phi_1$ is also applied to a delay circuit 122 by which a predetermined delay is imposed on clocking signal $\phi_1$ to generate clocking signal $\phi_2$. Clocking signal $\phi_2$ is applied to switch 56 via a line 124 and, in its inverted mode, via an inverter 126 and a line 128.

In order to explain the operation of comparator circuit 10 as illustrated in FIG. 2 by way of example, presume that a potential of 1 volt is applied at first input terminal 20 and a potential of 0 volts is applied at second input terminal 22. In such a situation, the gate 69 of FET 68 will be at a relatively positive potential and gate 75 of FET 74 will be at a relatively negative potential. Switches 54, 56 are initially both closed. To operate comparator apparatus 10 in a comparative mode, switch 54 is opened (in response to clocking signal $\phi_1$), thereby allowing first amplifier output 32 to "float" to a relatively negative potential and first amplifier output 34 to "float" to a relatively positive potential. Thus, second amplifier input 36 is at a relatively negative potential and second amplifier input 38 is at a relatively positive potential. Switch 56 is still maintained closed, thereby precluding any amplifying effect by second amplifier 16. At some point in time (following the predetermined delay imposed by delay circuit 122) switch 56 is opened (in response to clocking signal $\phi_2$), thereby isolating nodes A, A and allowing second amplifier 16 to amplify. Thus, when switch 56 is opened, the source 87 of FET 86 "floats" to a relatively positive potential and the source 85 of FET 84 "floats" to a relatively negative potential. As a consequence, latching amplifier input 44 is at a negative potential and latching amplifier input 46 is at a positive potential. This results in the drain 91 of FET 90 assuming a positive potential and the drain 93 of FET 92 assuming a negative potential. Consequently, gate 97 of FET 96 assumes a positive potential so that output 52 is at a positive potential.

Thus, the potential of output 52 is seen to follow the potential of first input terminal 20 relative to the potential of second input terminal 22.

It is to be understood that, while the detailed drawings and specific example given describe a preferred embodiment of the invention, they are for the purpose of illustration only, that the apparatus of the invention is not limited to the precise details and conditions disclosed and that various changes may be made therein without departing from the spirit of the invention which is defined by the following claims.

We claim:

1. An apparatus for comparing a first input signal with a second input signal and generating an output signal representative of said comparing in response to a clock signal; the apparatus comprising:

a plurality of amplifying means for amplifying signals;

a first amplifying means of said plurality of amplifying means being operatively connected to receive said first input signal and said second input signal and generating a pair of first amplifier signals at a pair of first amplifier outputs, said pair of first amplifier signals being representative of said first input signal and said second input signal; a second amplifying means of said plurality of amplifying means of said plurality of amplifying means being operatively connected to receive said pair of first amplifier signals and generate a pair of second amplifier signals at a pair of second amplifier outputs, said pair of second amplifier signals being representative of said pair of first amplifier signals;

a delay means for delaying signals; said delay means receiving said clock signal and generating a delayed clock signal, said delayed clock signal following said clock signal by a predetermined interval;

a first switching means for making and breaking electrical continuity; said first switching means being operatively connected across said pair of first amplifier outputs, said first switching means being responsive to said clock signal; and a second switching means for making and breaking electrical continuity; said second switching means being operatively connected across said pair of second amplifier outputs, said second switching means being responsive to said delayed clock signal; said predetermined interval being appropriate to facilitate substantial damping of noise introduced into said pair of first amplifier signals following opening of said first switching means.

2. An apparatus for comparing a first input signal with a second input signal and generating an output signal representative of said comparing as recited in claim 1 wherein said pair of second amplifier signals is received by a latching amplifying means of said plurality of amplifying means; said latching amplifying means generating said output signal.

3. An apparatus for comparing a first input signal with a second input signal and generating an output signal representative of said comparing as recited in claim 2 wherein said plurality of amplifying means includes an initial amplifying means; said initial amplifying means receiving said first input signal and said second input signal and generating a pair of initial amplifier outputs representative of said first input signal and said second input signal; said pair of initial amplifier outputs being operatively provided as inputs to said first amplifying means.

4. An apparatus for comparing a first input signal with a second input signal and generating an output signal representative of said comparing as recited in claim 3 wherein said initial amplifying means has a lower gain than said first amplifying means.

5. An apparatus for comparing a first input signal with a second input signal and generating an output signal representative of said comparing as recited in claim 1 wherein said pair of second amplifier signals is operatively provided to said first amplifier means in a positive feedback configuration appropriate to effect regenerative amplification in generating said pair of first amplifier signals.

6. An apparatus for comparing a first input signal with a second input signal and generating an output signal representative of said comparing as recited in claim 5 wherein said pair of second amplifier signals is received by a latching amplifying means of said plurality of amplifying means; said latching amplifying means generating said output signal.

7. An apparatus for comparing a first input signal with a second input signal and generating an output signal representative of said comparing as recited in claim 6 wherein said plurality of amplifying means includes an initial amplifying means; said initial amplifying means receiving said first input signal and said second input signal and generating a pair of initial amplifier outputs representative of said first input signal and said second input signal; said pair of initial amplifier outputs being operatively provided as inputs to said first amplifying means.

8. An apparatus for comparing a first input signal with a second input signal and generating an output signal representative of said comparing as recited in claim 7 wherein said initial amplifying means has a lower gain than said first amplifying means.

9. An apparatus for comparing a first input signal with a second input signal and generating an output signal representative of said comparing as recited in claim 1 wherein said plurality of amplifying means includes an initial amplifying means; said initial amplifying means receiving said first input signal and said second input signal and generating a pair of initial amplifier outputs representative of said first input signal and said second input signal; said pair of initial amplifier outputs being operatively provided as inputs to said first amplifying means.

10. An apparatus for comparing a first input signal with a second input signal and generating an output signal representative of said comparing as recited in claim 1 wherein said initial amplifying means has a lower gain than said first amplifying means.

* * * * *